(12) United States Patent
Tsau

(10) Patent No.: US 6,803,306 B2
(45) Date of Patent: Oct. 12, 2004

(54) HIGH DENSITY METAL CAPACITOR USING VIA ETCH STOPPING LAYER AS FIELD DIELECTRIC IN DUAL-DAMASCENCE INTERCONNECT PROCESS

(75) Inventor: Liming Tsau, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 156 days.

(21) Appl. No.: 09/753,664

(22) Filed: Jan. 4, 2001

(65) Prior Publication Data

US 2002/0086492 A1 Jul. 4, 2002

(51) Int. Cl.[7] .......................................... H01L 21/4763
(52) U.S. Cl. ...................... 438/622; 438/637; 438/638; 438/723; 438/724
(58) Field of Search ................................. 438/622, 637, 438/638, 723, 724, 743, 744, 381, 706, 711, 257

(56) References Cited

U.S. PATENT DOCUMENTS

| | | | |
|---|---|---|---|
| 5,162,258 A | 11/1992 | Lemnios et al. | 437/184 |
| 5,792,704 A | 8/1998 | Jun et al. | 438/624 |
| 5,972,192 A | 10/1999 | Dubin et al. | 205/101 |
| 5,990,015 A | 11/1999 | Lin et al. | 438/706 |
| 6,048,762 A | 4/2000 | Hsia et al. | 438/238 |
| 6,081,021 A | 6/2000 | Gambino et al. | |
| 6,225,207 B1 * | 5/2001 | Parikh | 438/622 |
| 6,297,162 B1 * | 10/2001 | Jang et al. | 438/706 |
| 6,329,234 B1 * | 12/2001 | Ma et al. | 438/210 |

FOREIGN PATENT DOCUMENTS

| | | | |
|---|---|---|---|
| EP | 1 073 101 A1 | 1/2001 | H01L/21/02 |
| WO | WO 00/46844 | 8/2000 | H01L/21/02 |

OTHER PUBLICATIONS

Smith, "Application–Specific Integrated Circuits," 8th Edition, May, 2000, Chapter 4, Programmable ASICS, 4.1 The Antifuse, pp. 170–174.
Institute of Microelectronics, "Deep Submicron—Advanced RFIC Integration," IME Strategic Focuses, http://www.ime.org.sg/deep/deep rfic.htm, Jun. 27, 2002, pp. 1–3.
Copy of European Search Report for Appln. No. EP 02 25 0004, Sep. 26, 2003 (date of completion of search), 3 pages.

* cited by examiner

Primary Examiner—Olik Chaudhuri
Assistant Examiner—Khiem Nguyen
(74) Attorney, Agent, or Firm—Sterne Kessler Goldstein & Fox PLLC

(57) ABSTRACT

A metal-insulator-metal (MIM) capacitor is made according to a copper dual-damascene process. A first copper or copper alloy metal layer if formed on a substrate. A portion of the first metal layer is utilized as the lower plate of the MIM capacitor. An etch stop dielectric layer is used during etching of subsequent layers. A portion of an etch stop layer is not removed and is utilized as the insulator for the MIM capacitor. A second copper or copper alloy metal layer is later formed on the substrate. A portion of the second metal layer is utilized as the upper plate of the MIM capacitor.

14 Claims, 13 Drawing Sheets

(CASE 1 ALL LAYERS)

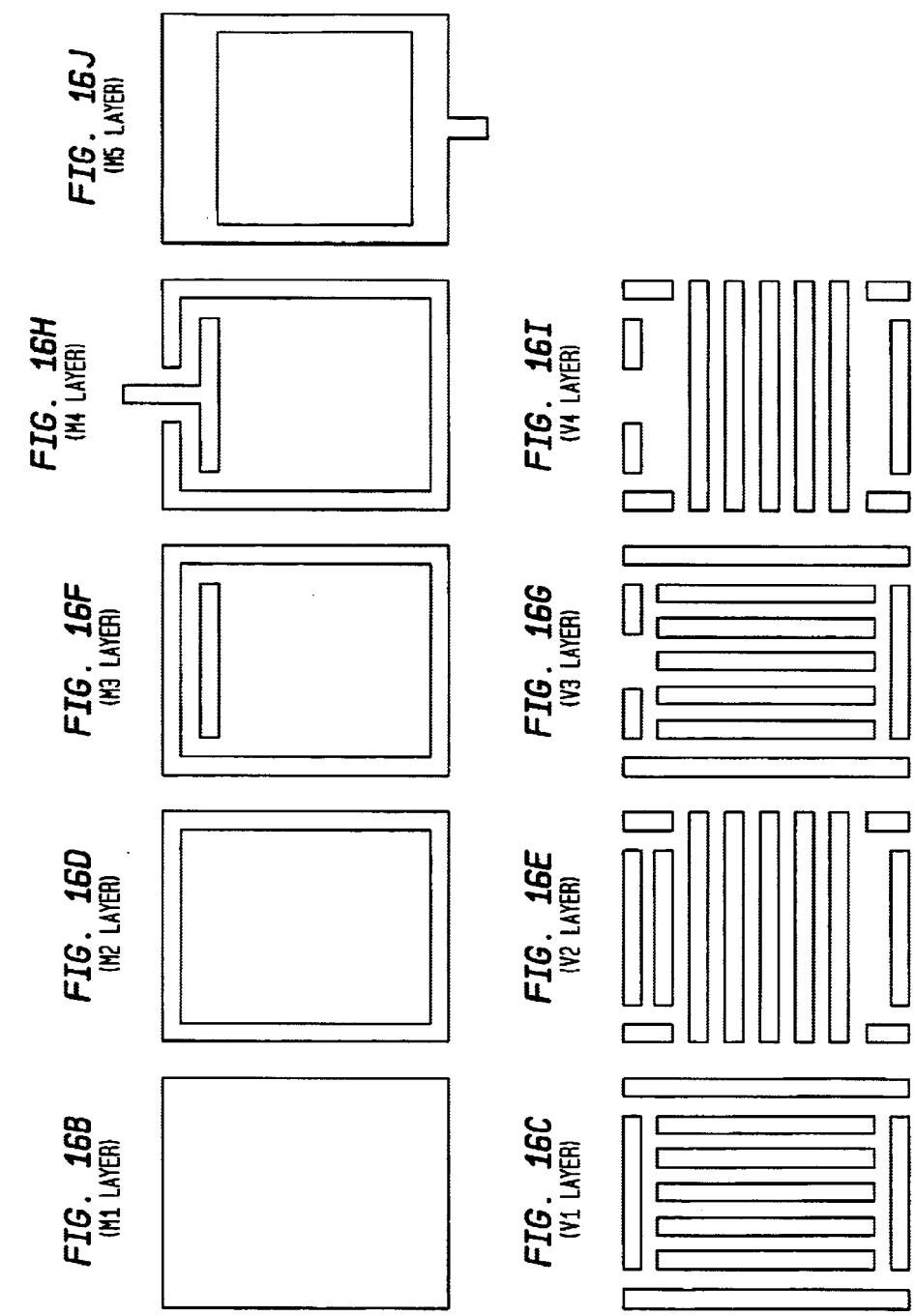

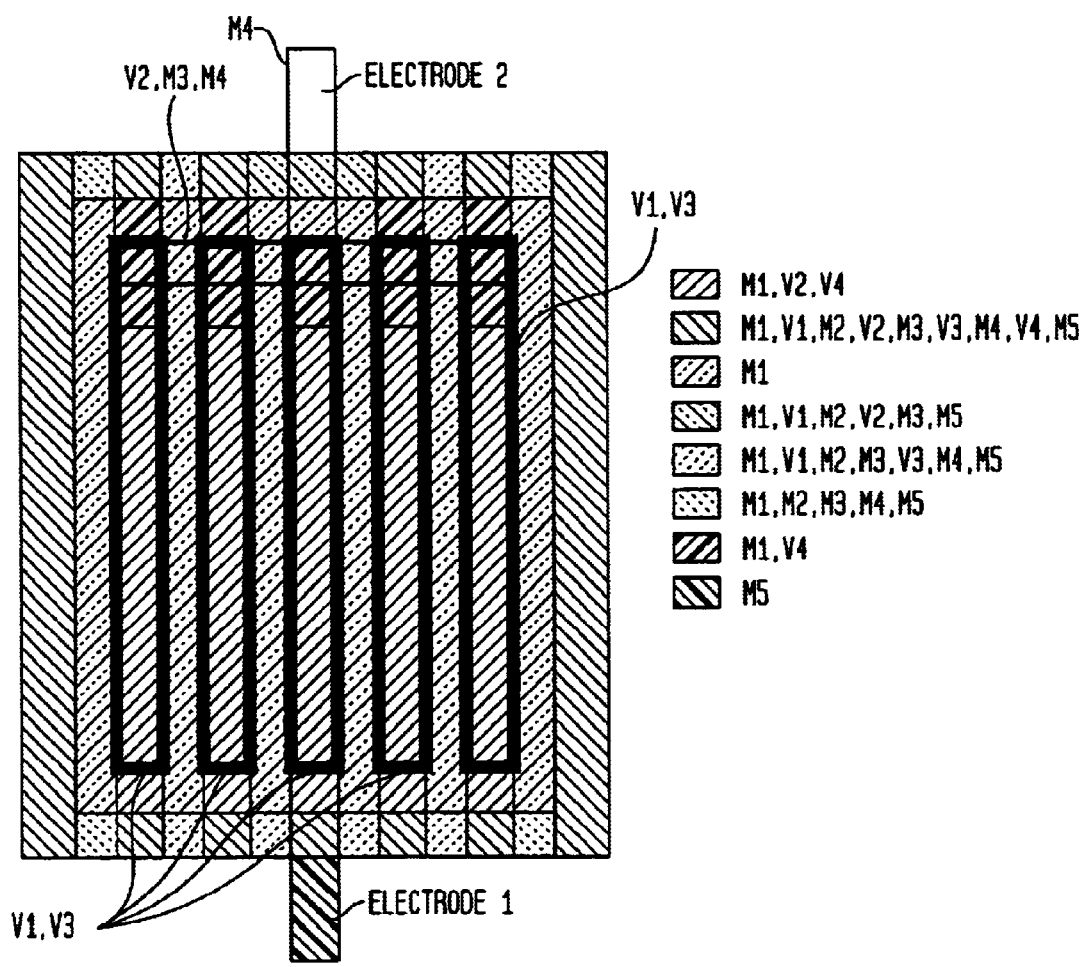

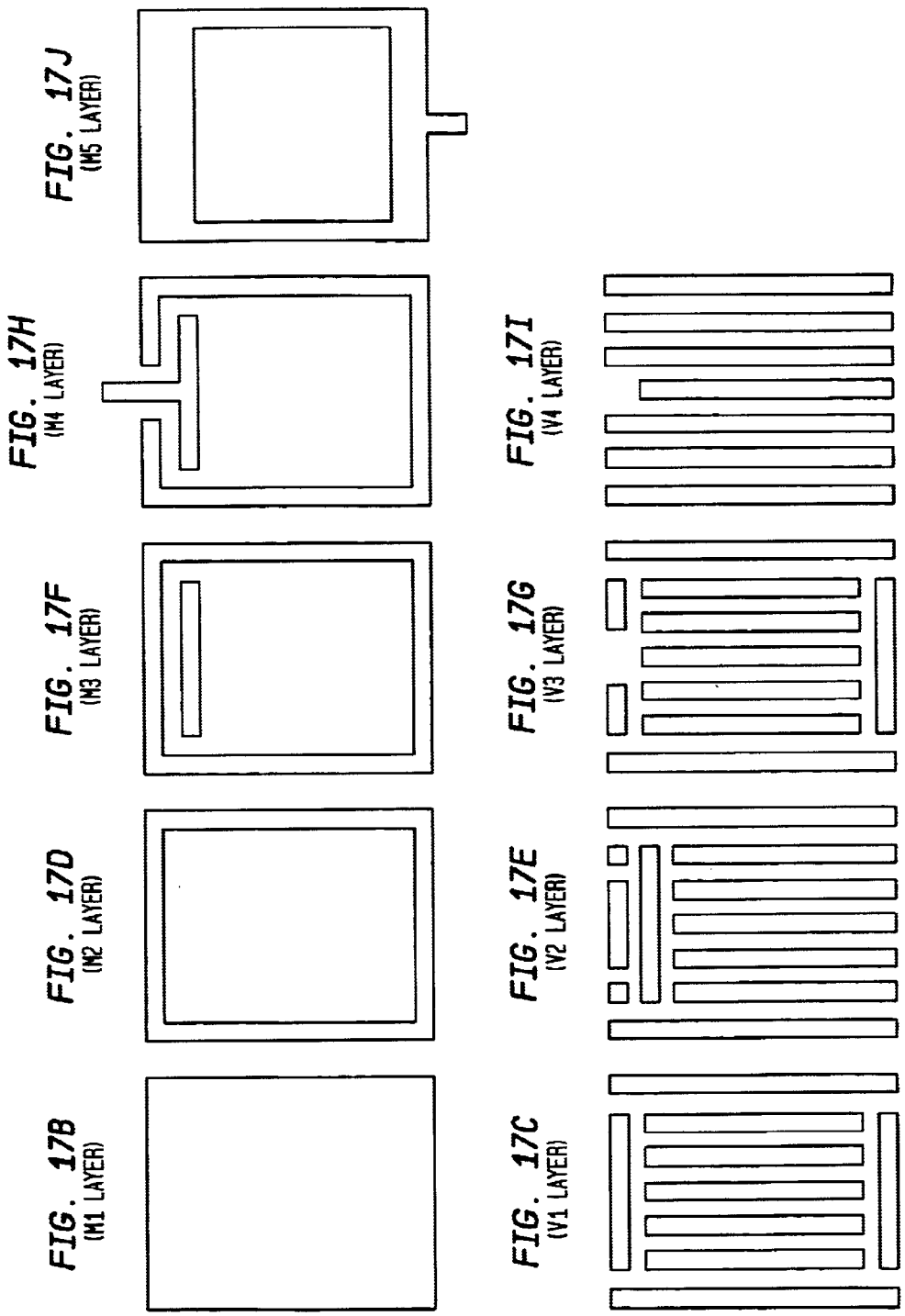

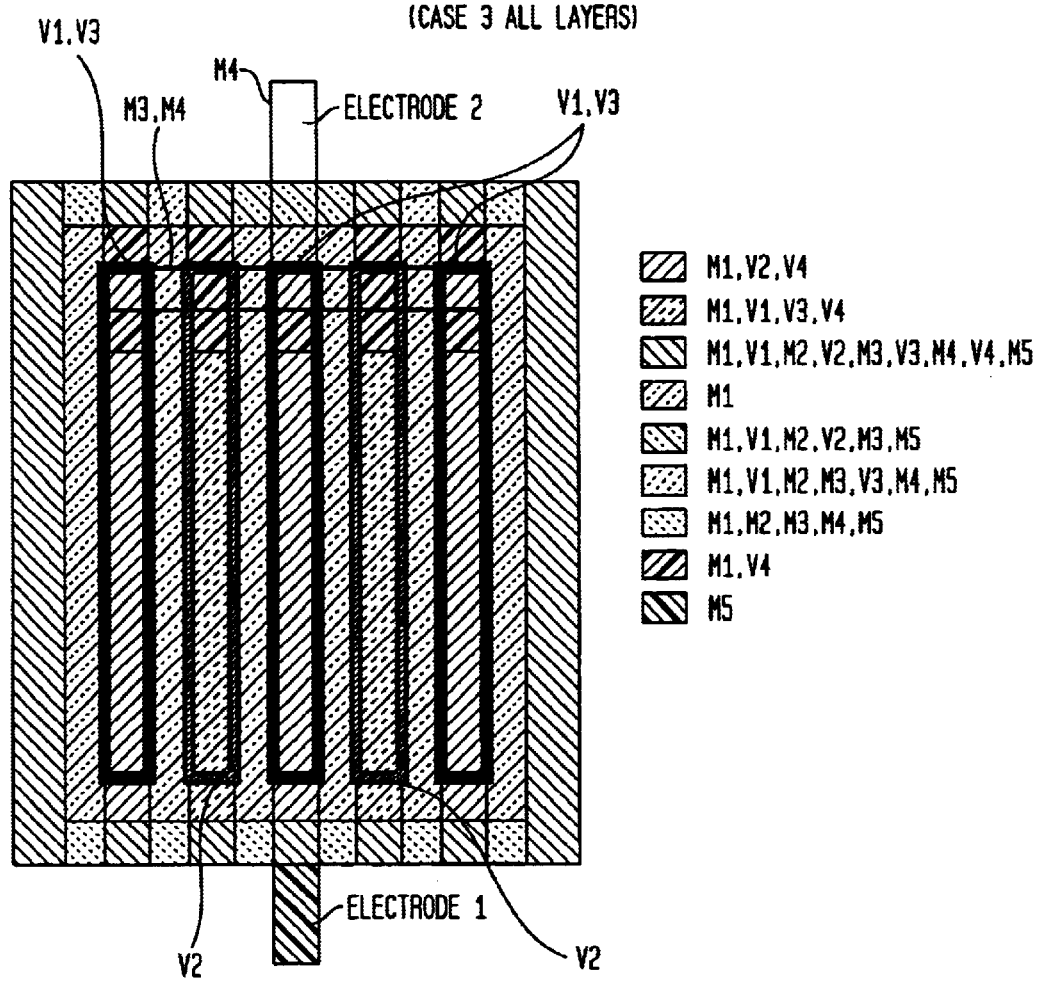

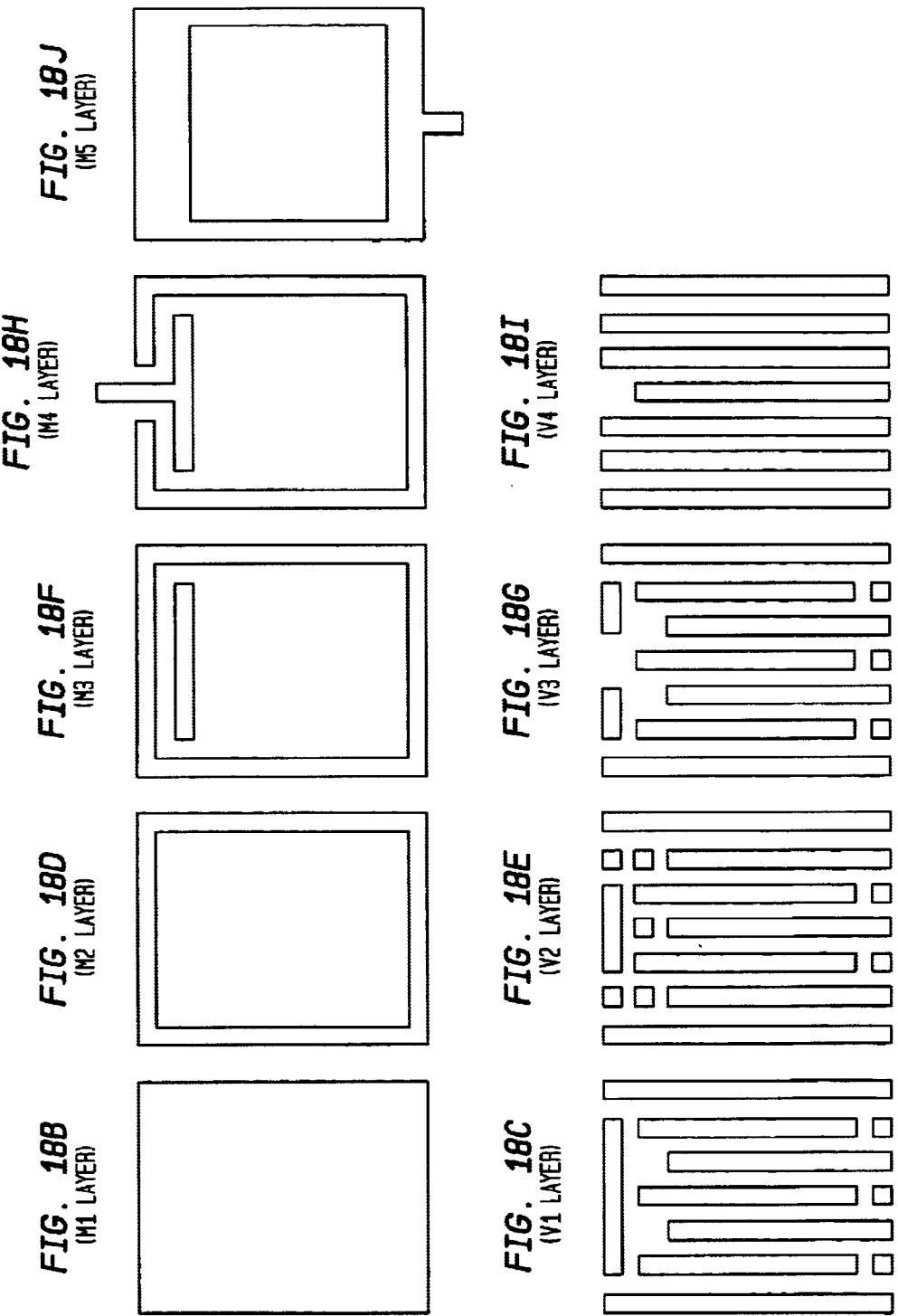

(CASE 4 ALL LAYERS)

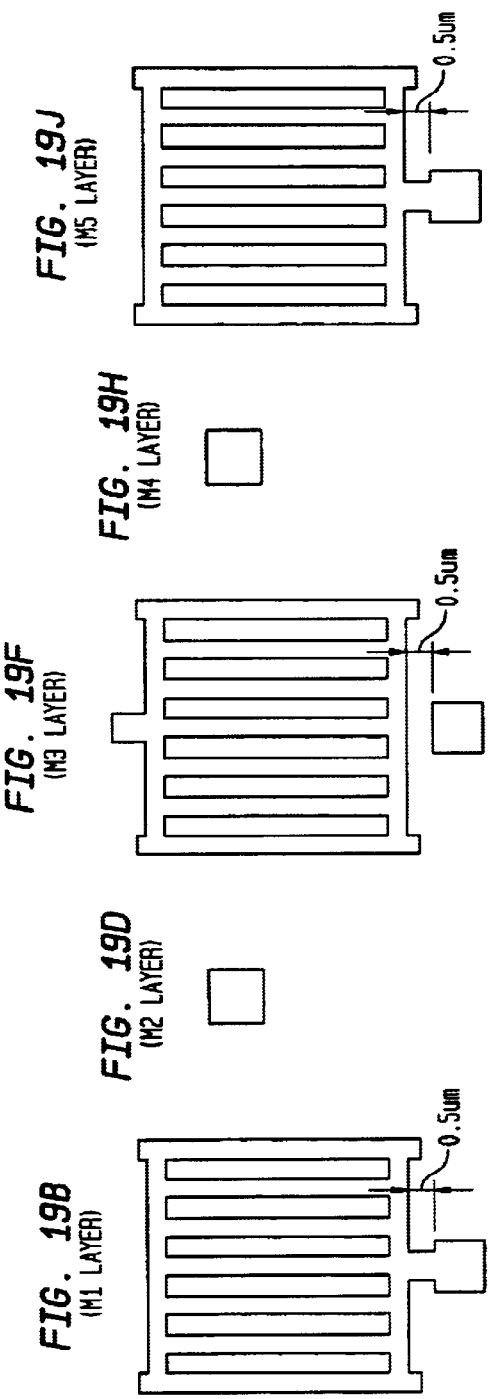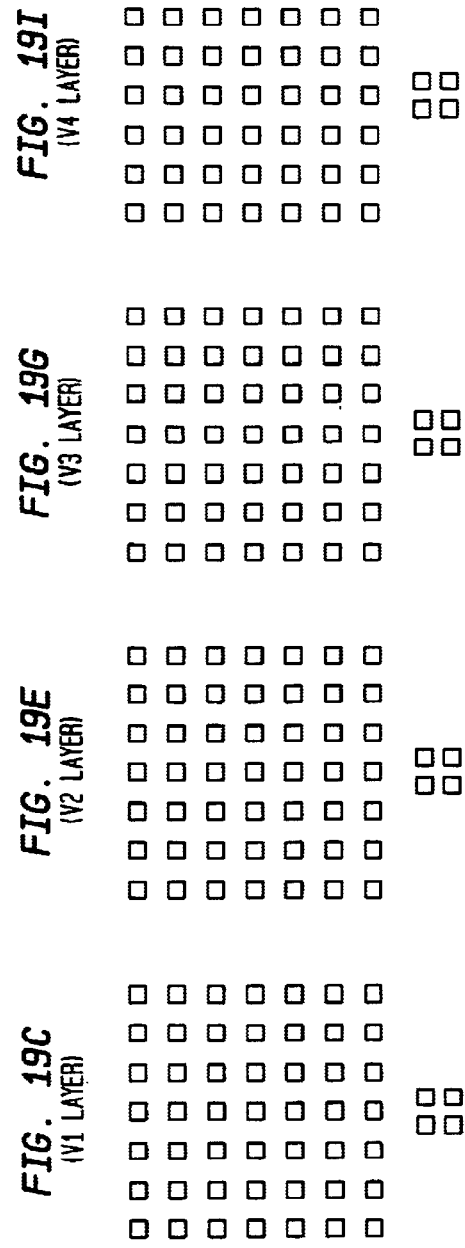

HIGH DENSITY METAL CAPACITOR USING VIA ETCH STOPPING LAYER AS FIELD DIELECTRIC IN DUAL-DAMASCENCE INTERCONNECT PROCESS

BACKGROUND OF THE INVENTION

1. Field of the Invention

The present invention relates generally to semiconductor structures and manufacturing. More particularly, the present invention relates to the formation of metal-insulator-metal capacitors.

2. Related Art

Advances in semiconductor manufacturing technology have led to the integration of millions of circuit elements, such as transistors, on a single integrated circuit (IC). In order to integrate increasing numbers of circuit elements onto an IC it has been necessary to reduce the dimensions of the various component parts. Not only have interconnect line widths become smaller, but so have the dimensions of metal-oxide-semiconductor field effect transistors and other integrated devices, such as capacitors.

Metal-electrode capacitors are widely used in mixed-signal/radio frequency (RF) ICs for better linearity and higher Q (quality factor) (due to lower electrode resistance). MIM (metal-insulator-metal) capacitors have been commercially available in the standard CMOS (complimentary metal oxide silicon) mixed-signal process with aluminum interconnect, by adding steps to the process flow. However, similar MIM capacitors are being developed for the most advanced copper interconnects, which is replacing the aluminum interconnects in the 0.15 $\mu$m (micrometer=$10^{-6}$) generation and beyond. Due to the uniqueness in the copper damascene process, there is no simple/low-cost way of making MIM capacitors.

What is desired is a method of making copper MIM capacitors using fully compatible CMOS logic process techniques.

SUMMARY OF THE INVENTION

The capacitors made according to the present invention are specially designed for the copper dual-damascene process. These capacitors are fully CMOS logic process compatible. There are no extra process steps required and hence no extra cost.

The invention comprises forming a first copper or copper alloy metal layer in a first dielectric layer over a substrate. An etch stop layer and a second dielectric layer are formed on the first dielectric layer and first metal layer.

A patterned masking layer (known as the via photo resist layer) is formed over the second dielectric layer. The exposed portion of the second dielectric layer is removed, so that a first opening (say, for the capacitor) and a second opening (say, for the via) are formed in the second dielectric layer, thereby exposing portions of the stop layer above a first region and a second region of the first metal layer, respectively.

Another patterned masking layer (known as the metal photo resist layer) is formed such that a further portion of the second dielectric layer and a portion of the stop layer are exposed. The exposed portions of the second dielectric layer and the stop layer are removed, thereby exposing a portion of the second region of the first metal layer. The first and the second openings are filled with a copper or copper alloy thereby forming a second metal layer, wherein a MIM capacitor is formed by the first region of the first metal layer, the stop layer and the filled first opening, and the filled second opening forms a via between the first and second metal layers.

In the advanced CMOS process, there are typically several metal layers. By repeating the above process for multiple layers, a stacked MIM capacitance can form to achieve high density (that is, with high capacitance per unit area.)

These and other objects, advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

FIGS. 16A–J, 17A–J, 18A–J and 19A–J illustrate four examples of metal capacitors, according to the present invention.

DETAILED DESCRIPTION OF THE PREFERRED EMBODIMENTS

Overview

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially orthogonal to the surface of a substrate.

Method

In a dual-damascene process, there is usually a dielectric layer on top of the metal, which is used as an etch stopping layer for the via etch. This layer is always removed in the subsequent metal trench etch. However, the inventor has discovered that by violating the design by drawing a via layer without a metal layer on top of it, this etch stopping layer can be used as the field dielectic between the bottom metal and the via layer to form a MIM capacitor.

In a "via-first" dual-damascene process (such as case in the TSMC 0.13 μm process; for more information contact TSMC North America, 2585 Junction Avenue, San Jose, Calif. 95134 USA), a via/metal definition to form a MIM copper capacitor according to the present invention can be achieved by the following process steps.

Figure 1:
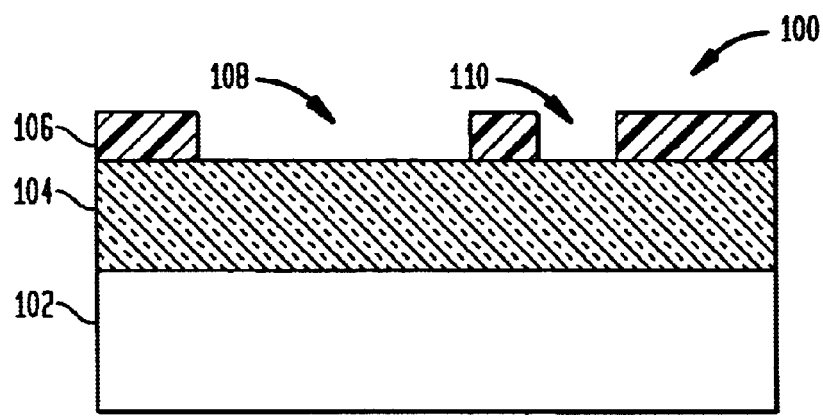
FIGS. 1–15 illustrate a process for making a metal-insulator-metal capacitor, according to the present invention.

FIG. 1 illustrates a device 100, having a substrate 102, typically comprised of silicon. Substrate 102 can have formed therein a plethora of microelectronic or micromechanical structures, as would become apparent to a person skilled in the semiconductor art. A first dielectric layer 104 is formed on substrate 102 in a convention manner, such as oxidation, deposition, or the like processes. In a preferred embodiment, first dielectric layer 104 comprises silicon dioxide ($SiO_2$), but other dielectric material are substitutable, as would also become apparent to a person skilled in the semiconductor art. A mask layer 106 (e.g., photoresist or simply "resist") is formed on first dielectric layer 104, and is patterned according to know photolithographic techniques to form exposed areas 108 and 110. Mask layer 106 is also referred to as a patterned masking layer or a first patterned masking layer.

Figure 2:
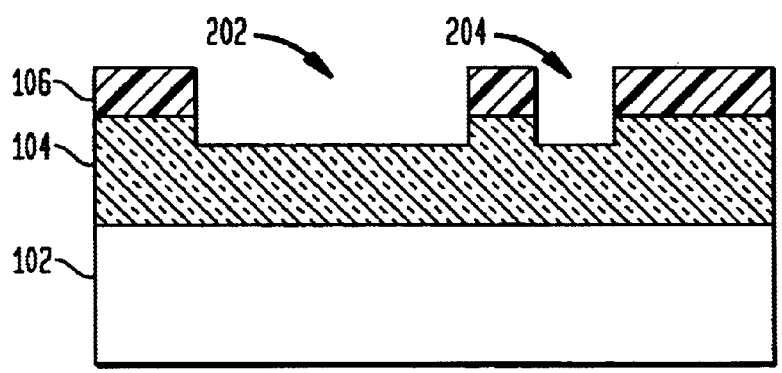
Figure 3:
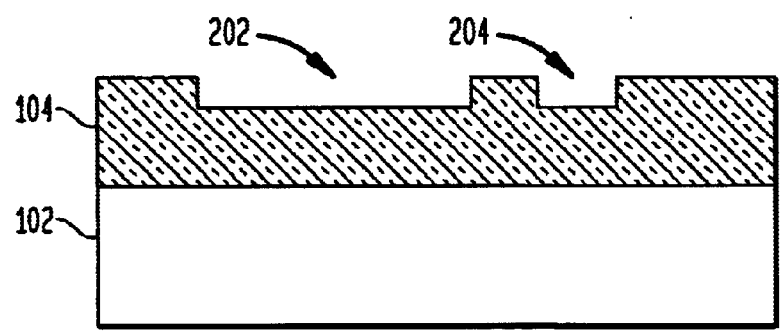
Figure 4:
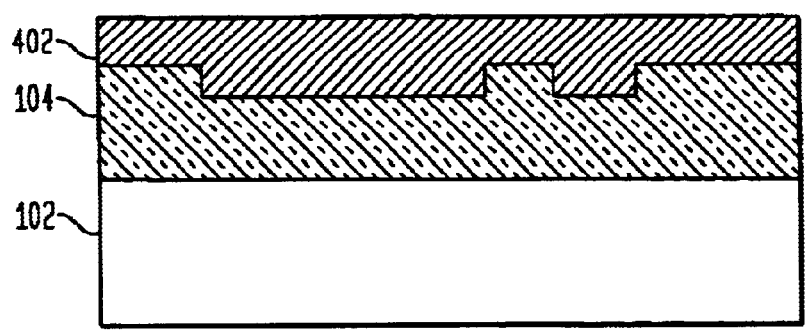
Figure 5:
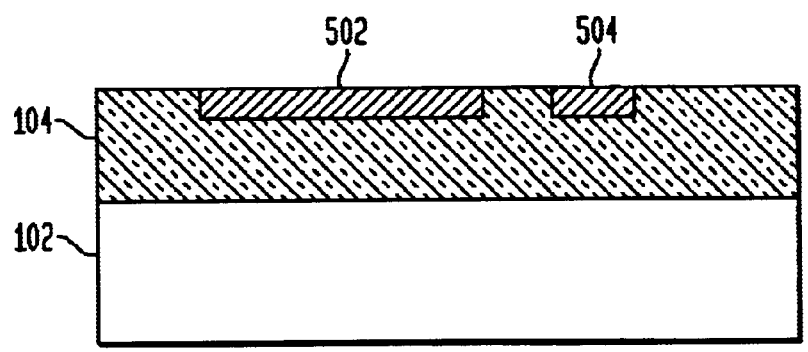

Trenches 202 and 204 in the first dielectric layer 104 are then chemically etched at areas 108 and 110, resulting is the structure illustrated in FIG. 2. Then mask layer 106 is removed by known techniques, as illustrated in FIG. 3. Copper or a copper alloy 402 is flowed over the substrate to fill trenches 202 and 204, as illustrated in FIG. 4. Deposition or other known techniques can be used. Excess metal is removed by chemical metal polishing (CMP), or other know techniques, as illustrated in FIG. 5. Thus, FIG. 5 shows a first metal layer formed in the first dielectric layer 104, including a first region 502 and a second region 504. In another embodiment a barrier metal, such as titanium nitride (TiN), can be formed beneath the copper/copper alloy is desired, as would be apparent to a person skilled in the relevant art.

Figure 6:
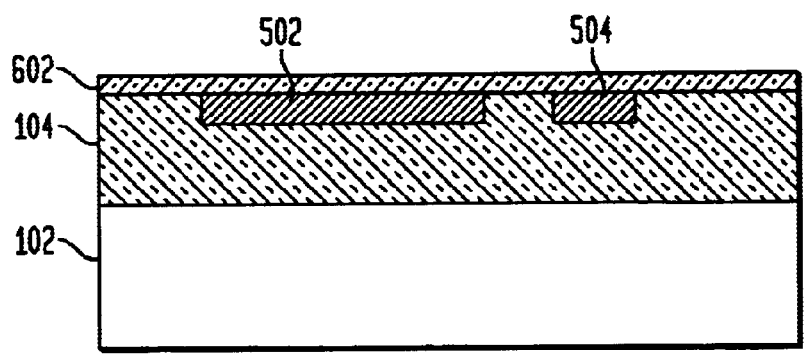
Figure 7:
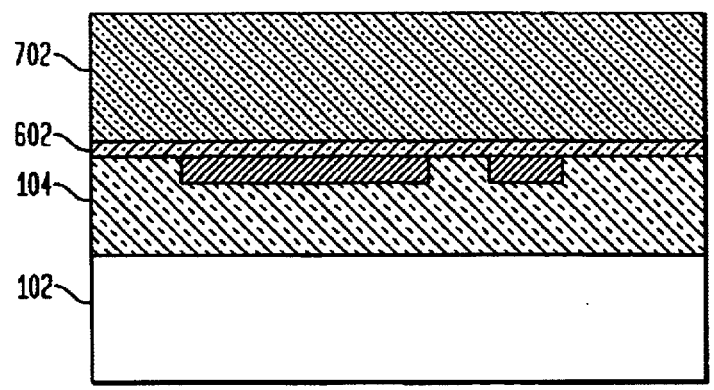

The formation of etch stopping layer 602, is followed by the formation of a second dielectric layer 702, as illustrated at FIGS. 6 and 7, respectively. In a preferred embodiment, second dielectric layer 702 (also called an inter-metal dielectric) comprises $SiO_2$, but other low-k dielectric material are substitutable, as would become apparent to a person skilled in the relevant art. Etch stop layer 602 preferably comprises silicon nitride (SiN), but other suitable etch stop layers are substitutable. Etch stop layer 602 is used to prevent copper of the previous metal (the first metal layer "M1") from exposure to the resist strip chemicals during subsequent processing to be described below. The following drawings shows cross-sectional views of the interconnect layers after a via etch and strip process. Deposition or other known techniques can be used to form layers 602 and 702.

Figure 8:
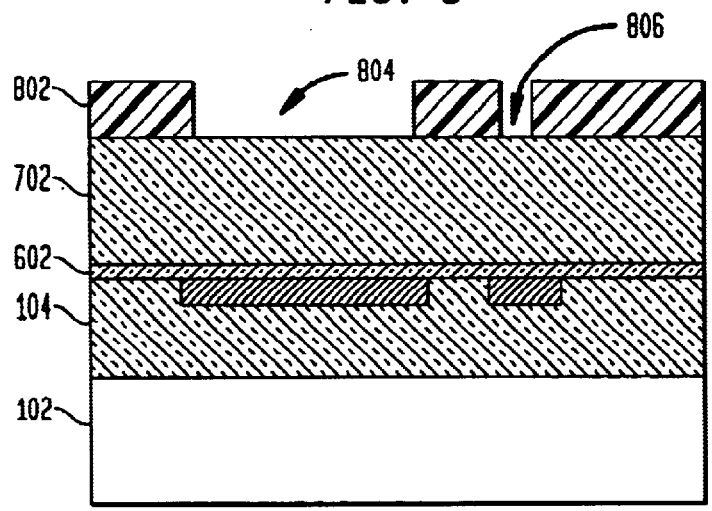
Figure 9:
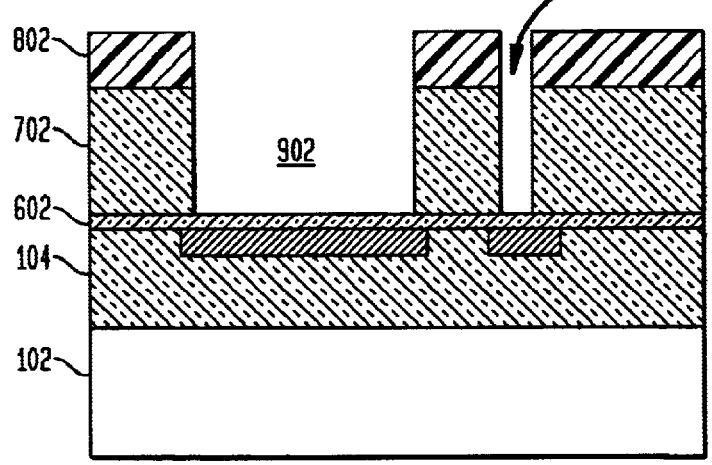
Figure 10:
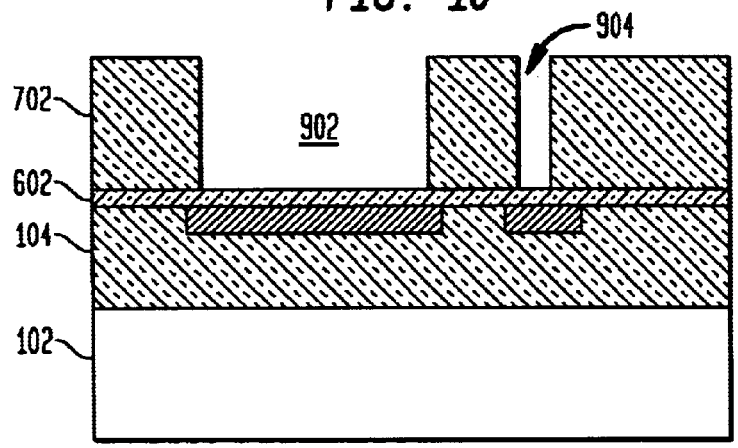

FIG. 8 illustrates a another mask layer 802 formed on the second dielectric layer 702. Mask layer 802 is also referred to as a resist, patterned masking layer or a second patterned masking layer. Mask layer 802 is patterned according to know photolithographic techniques to exposed areas 804 and 806 of the second dielectric layer 702, which are located above the first metal regions 502 and 504, respectively. The second dielectric layer 702 is chemically etched, or the like, using mask layer 802 to form holes 902 and 904, as illustrated in FIG. 9. Etch stop layer 602 prevents the resist strip chemicals from etching the first metal layer (i.e., regions 502 and 504). Mask 802 is then removed using know techniques, as illustrated in FIG. 10. According to the present invention, hole 902 will eventually be filled to form an upper plate of the MIM capacitor. Hole 904 will be filled to form a "via" for electrically coupling the first metal layer with a second metal layer.

Figure 11:
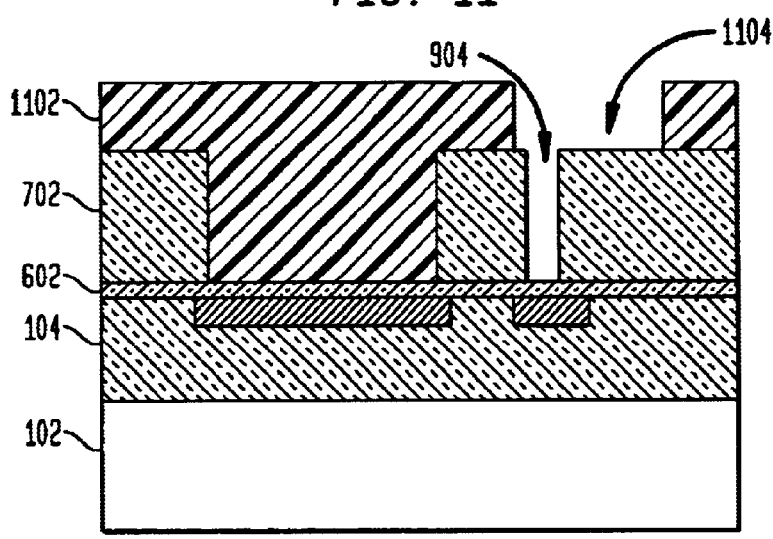
Figure 12:
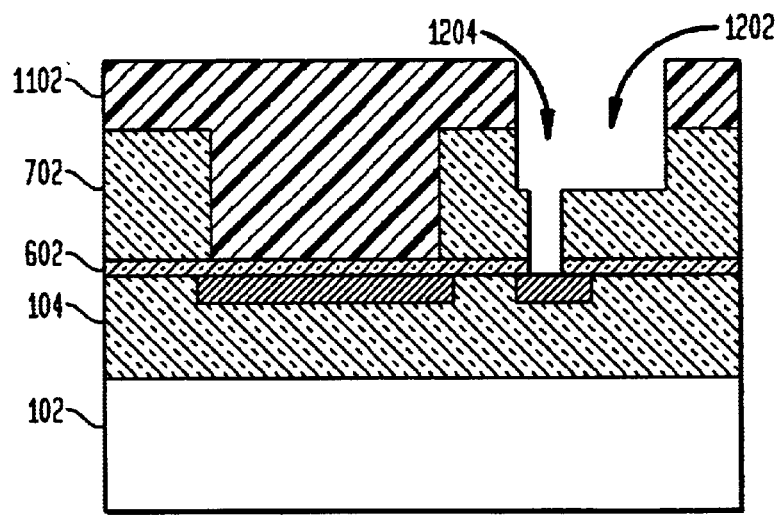
Figure 13:
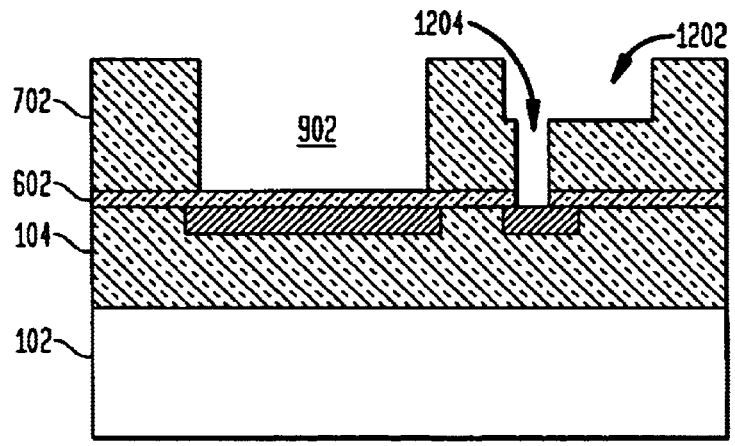

FIG. 11 illustrates the application of yet another mask layer 1102. Mask layer 1102 is also referred to as a resist, patterned masking layer or a third patterned masking layer. Mask layer 1102 is patterned at region 1104 so as to leave a portion of the second dielectric layer 702 and hole 904 exposed, but hole 902 is filled. After chemically etching, or the like, using mask layer 1102, an additional trench 1202 of the second dielectric layer 702 is removed, as illustrated in FIG. 12. FIG. 12 also illustrates that a hole 1204 of the etch stop layer 602 is removed from the bottom of the via (hole 904) by the process. However, the portion of the etch stop layer 602 associated with hole 902 remains to form the insulator portion of the MIM capacitor according to the present invention. Mask layer 1102 is removed, as illustrated at FIG. 13, thereby re-exposing etch stop layer 602 at he bottom of hole 902.

Figure 14:
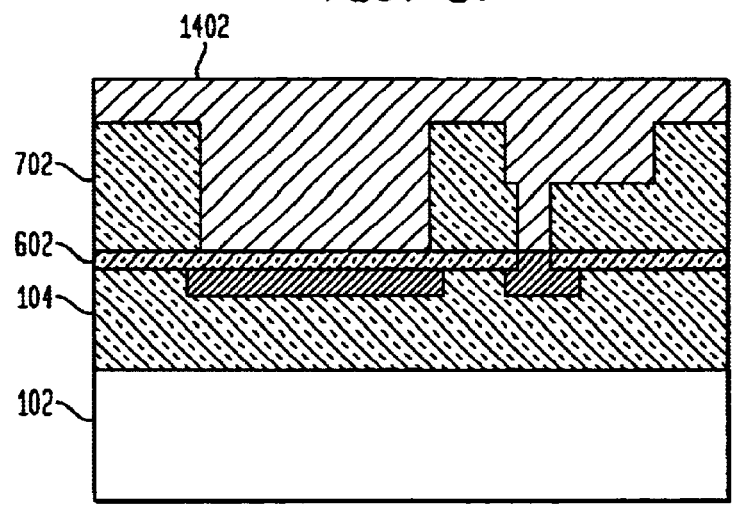
Figure 15:
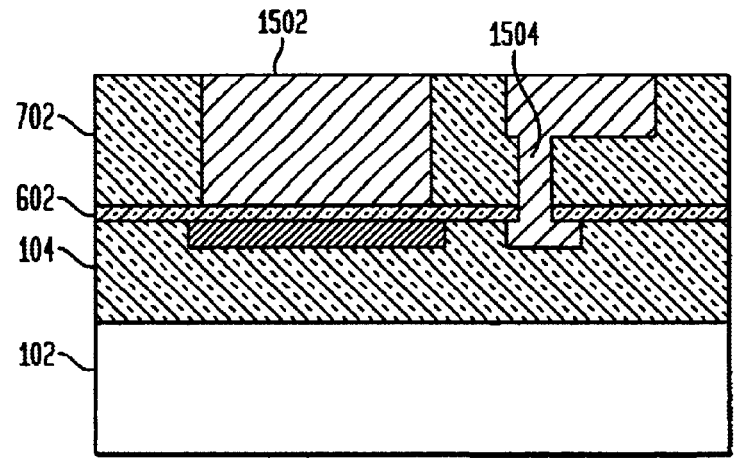

FIG. 14 illustrates the flowing of a second (copper or copper alloy) metal layer 1402 (also called "M2"). FIG. 15 illustrates CMP (or the like) of the second metal layer completes an upper plate 1502 of the MIM capacitor. A filled via 1504 is also formed as part of the second metal layer. In another embodiment a barrier metal, such as titanium nitride (TiN), can be formed beneath the copper/copper alloy is desired, as would be apparent to a persona skilled in the semiconductor art.

Structure

Four examples of metal capacitors according to the present invention, using the SiN etch stopping layers as the dielectric, are illustrated in FIGS. 16, 17, 18 and 19. For simplicity, only five (5) via fingers per electrode are shown in each case. In reality, the structure can be much larger for higher capacitance value. Also in each case, the entire electrode number 2 is caged in electrode number 1 (which is usually grounded) for noise isolation. Although the capacitors are square, any convenient topology can be implemented without departing from the spirit and scope of the invention.

Figure 16A:
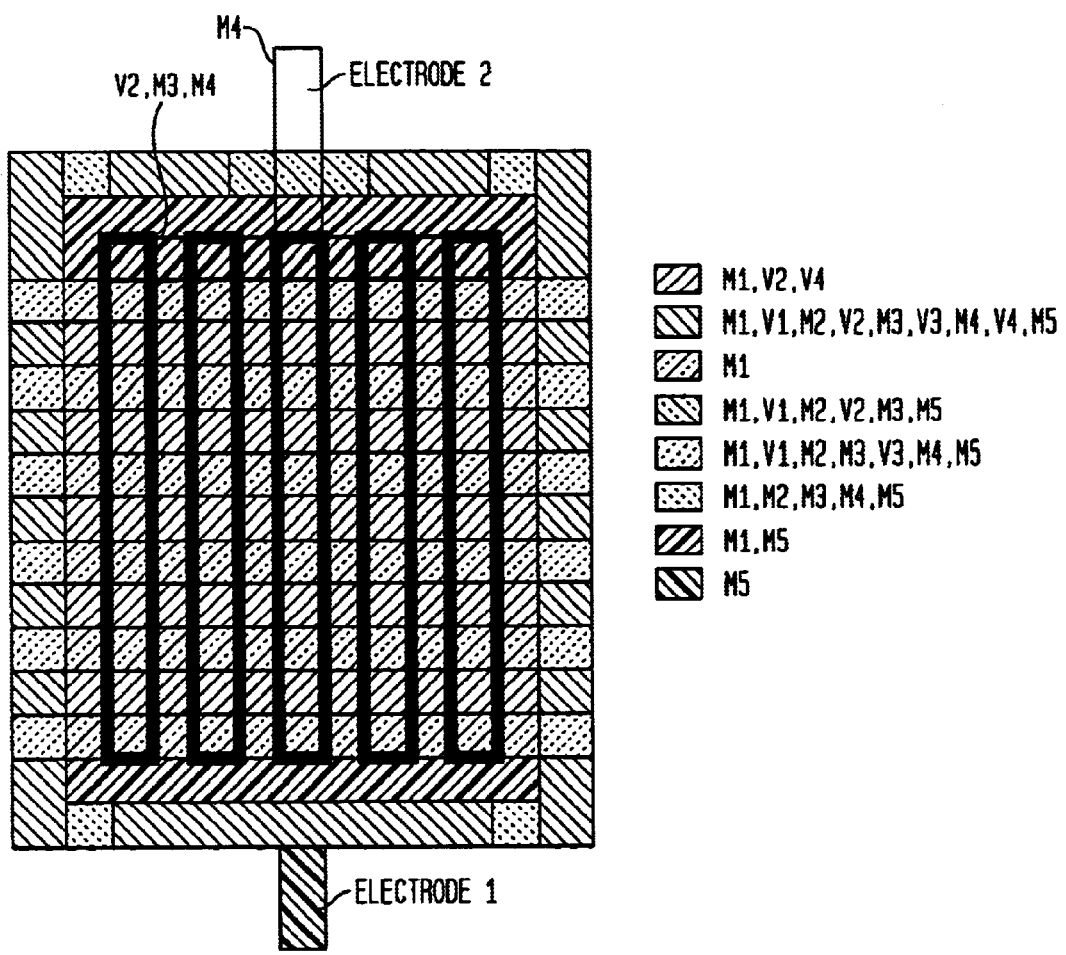

In the first example of FIG. 16, the two electrodes are perpendicular to each other, which makes the absolute value of the capacitance least sensitive the photo mis-alignments. FIG. 16A illustrates five (5) mask layers and four (4) via layers, as shown in the Key. Those layers are further illustrated in FIGS. 16B–J, respectively.

In the second example of FIG. 17, the capacitance value is about twice of that in the first case in FIG. 16. The second example can be used when the circuit is not sensitive to the absolute value of the total capacitance, but the matching of two capacitors in the same die is desired. FIG. 17A also illustrates five (5) mask layers and four (4) via layers, as shown in the Key. Those layers are further illustrated in FIGS. 17B–J, respectively.

In the third example of FIG. 18, the capacitance value can be even larger than the second example due to the extra intra-layer metal coupling. Like the second case, these type of capacitors are sensitive to photo misalignment and can be used when the capacitance matching is desired. FIG. 18A also illustrates five (5) mask layers and four (4) via layers, as shown in the Key. Those layers are further illustrated in FIGS. 18B–J, respectively.

Figure 19A:
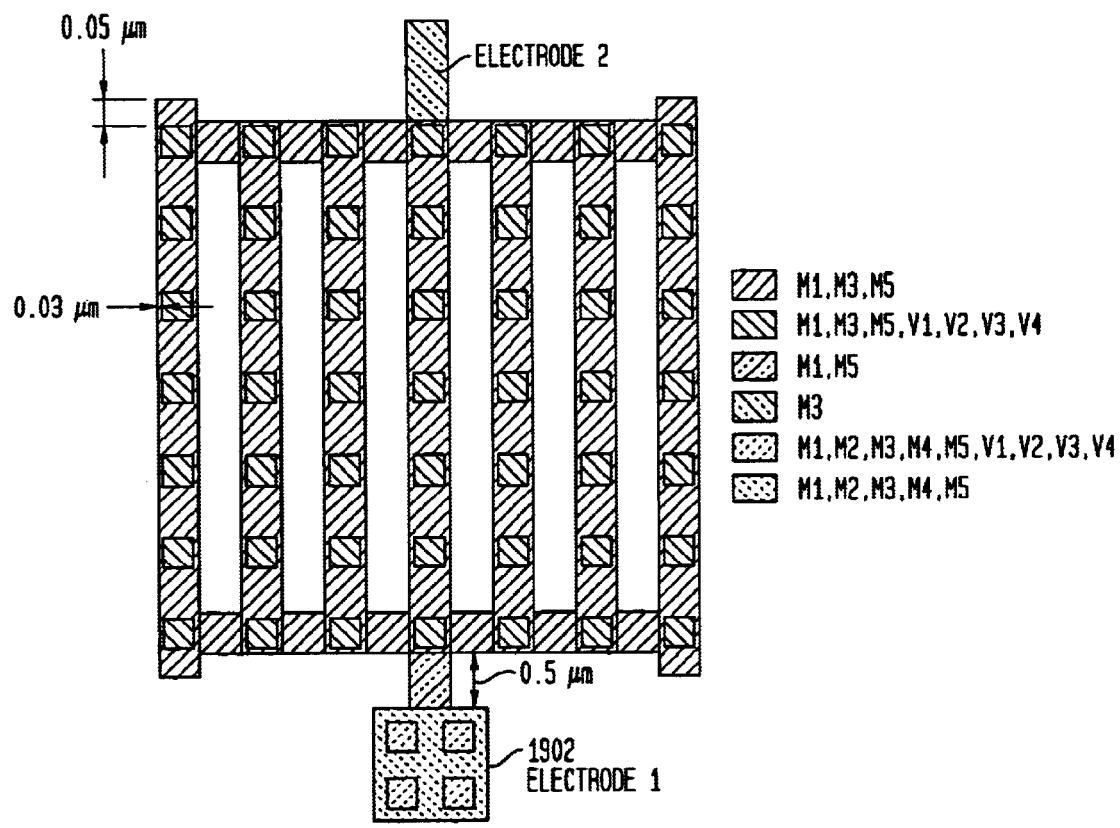

In the fourth example of FIG. 19, a 25×25 array has 25 fingers. Electrode 1 at 1902 is to connect the M1 electrode to the M5 electrode. The size/space for the 4 vias at 1902 is 0.19 μm/0.22 μm, for example. The size of this metal is 0.7×0.7 μm. FIG. 19A also illustrates five (5) mask layers and four (4) via layers, as shown in the Key. Those layers are further illustrated in FIGS. 19B–J, respectively.

Conclusion

An advantage of the present invention is the ability to manufacture mixed-signal products by using standard CMOS logic process for lower wafer cost and shorter process time. Reduction in the capacitor area with good yield means reduction in the wafer cost. Accordingly, the present invention provides very high density capacitors for today's most advanced copper interconnect processes.

The present invention may be implemented with various changes and substitutions to the illustrated embodiments. For example, the present invention may be implemented on substrates comprised of materials other that silicon, such as, for example, gallium arsenide or sapphire. Additionally, illustrative embodiments describe vias between two levels of interconnect, however those skilled in the art will recognize that many interconnect levels may be formed in accordance with the present invention.

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A metal-insulator-metal capacitor process, comprising:
   forming a first dielectric layer on a substrate;
   forming a first metal layer in the first dielectric layer;
   forming a stop layer on the first dielectric layer;
   forming a second dielectric layer on the stop layer;
   forming a first patterned mask layer on the second dielectric layer;
   performing an etching process, using the first patterned mask layer as an etching mask, so that a first opening and a second opening are formed in the second dielectric layer, thereby exposing portions of the stop layer above a first region and a second region of the first metal layer, respectively;
   forming a second patterned mask layer on the second dielectric layer and a part of the stop layer;
   performing a further etching process, using the second patterned mask layer as a further etching mask, to etch the stop layer below the second opening and to partially etch a third opening adjacent the second opening in the second dielectric layer without exposing the stop layer thereunder; and
   forming a second metal layer over the substrate so as to fill the first, second and third openings;
   wherein a metal-insulator-metal (MIM) capacitor is formed by the first region of the first metal layer, the stop layer and the filled first opening, and the filled second opening forms a via between the first and second metal layers, and the first and second metal layers include copper.

2. The process according to claim 1, wherein the first dielectric layer includes a silicon oxide layer.

3. The process according to claim 1, wherein the stop layer includes a silicon nitride layer.

4. The process according to claim 1, wherein the second dielectric layer includes a silicon oxide layer.

5. The process according to claim 1, wherein the second metal layer is polished by chemical-mechanical polishing.

6. The process according to claim 1, wherein said forming the first metal layer includes polishing by chemical-mechanical polishing.

7. The process according to claim 1, wherein the first and second dielectric layers are thicker than the stop layer.

8. A metal-insulator-metal capacitor process, comprising:
   forming a first dielectric layer on a substrate;
   forming a first patterned masking layer over the substrate such that a portion of the first dielectric layer is exposed;
   removing only a depth-wise portion the exposed portion of the first dielectric layer such that the substrate is not exposed;
   filling the removed portions of the first dielectric layer with a copper or copper alloy thereby forming a first metal layer;
   forming a stop layer on the first dielectric layer and the first metal layer;
   forming a second dielectric layer on the stop layer;
   forming a second patterned masking layer over the substrate such that a portion of the second dielectric layer is exposed;
   removing the exposed portion of the second dielectric layer, so that a first opening and a second opening are formed in the second dielectric layer, thereby exposing portions of the stop layer above a first region and a second region of the first metal layer, respectively;
   forming a third patterned masking layer over the substrate such that a further portion of the second dielectric layer and a portion of the stop layer are exposed;
   removing the exposed portions of the second dielectric layer and the stop layer, thereby exposing a portion of the second region of the first metal layer;
   filling the first and the second openings with a copper or copper alloy thereby forming a second metal layer;
   wherein a metal-insulator-metal (MIM) capacitor is formed by the first region of the first metal layer, the stop layer and the filled first opening, and the filled second opening forms a via between the first and second metal layers.

9. The process according to claim 8, wherein the first dielectric layer includes a silicon oxide layer.

10. The process according to claim 8, wherein the stop layer includes a silicon nitride layer.

11. The process according to claim 8, wherein the second dielectric layer includes a silicon oxide layer.

12. The process according to claim 8, wherein the second metal layer is polished by chemical-mechanical polishing.

13. The process according to claim 8, wherein said forming the first metal layer includes polishing by chemical-mechanical polishing.

14. The process according to claim 8, wherein the first and second dielectric layers are thicker than the stop layer.

* * * * *